(12) United States Patent  (10) Patent No.: US 7,778,090 B2
Perner et al.  (45) Date of Patent: Aug. 17, 2010

(54) BUFFER CIRCUIT FOR A MEMORY MODULE

(75) Inventors: Martin Perner, Munich (DE); Nermin Hamzabegovic, Munich (DE)

(73) Assignee: Qimonda AG, Munich (DE)

( * ) Notice: Subject to any disclaimer, the term of this patent is extended or adjusted under 35 U.S.C. 154(b) by 440 days.

(21) Appl. No.: 11/893,415

(22) Filed: Aug. 16, 2007

(65) Prior Publication Data

US 2009/0049267 A1 Feb. 19, 2009

(51) Int. Cl.
*G11C 7/10* (2006.01)
(52) U.S. Cl. .......................... 365/189.05; 365/189.08; 365/230.08
(58) Field of Classification Search ............ 365/189.05, 365/189.08, 230.06, 230.08
See application file for complete search history.

(56) References Cited

U.S. PATENT DOCUMENTS

| | | | |
|---|---|---|---|
| 6,873,563 B2* | 3/2005 | Suwa et al. ............ | 365/230.03 |
| 6,930,904 B2* | 8/2005 | Wu .............................. | 365/72 |
| 6,961,281 B2* | 11/2005 | Wong et al. ............ | 365/230.03 |
| 7,020,757 B2* | 3/2006 | Ruhovets et al. ............ | 711/167 |
| 7,073,099 B1* | 7/2006 | Sutardja et al. ............. | 714/710 |
| 7,394,690 B2* | 7/2008 | Moogat et al. ......... | 365/185.09 |
| 7,478,308 B1* | 1/2009 | Solt et al. .................... | 714/763 |
| 7,567,466 B2* | 7/2009 | Cernea ................... | 365/189.05 |

* cited by examiner

*Primary Examiner*—Richard Elms
*Assistant Examiner*—Hien N Nguyen
(74) *Attorney, Agent, or Firm*—Patterson & Sheridan, L.L.P.

(57) ABSTRACT

The invention provides a buffer circuit for a memory module including at least one configuration register bank for storing configuration data of the memory module, an error check logic for performing an error check of input signals applied to the memory module via input pins of the memory module to generate a signature output by the memory module via at least one output pin of the memory module, and a controller which depending on an output request setting stored in a configuration register of the configuration register bank reads out information data the buffer circuit via the output pin of the memory module.

39 Claims, 10 Drawing Sheets

FIG 6A

Output Request Setting (ORS)

| Output Request Bit | Seperation Bit | Content bit $C_A$ | Content bit $C_B$ |
|---|---|---|---|

FIG 6B

Access Mode Control Setting (AMCS)

| Stopp Signature On/Off | Prefix On/Off | Postfix On/Off | Slow Mode On/Off |
|---|---|---|---|

FIG 6C

Content Bits

| $C_A$ | $C_B$ | |
|---|---|---|
| 0 | 0 | ID-Output |
| 0 | 1 | Reg-Dump |
| 1 | 0 | Sensor Value Read |
| 1 | 1 | not defined |

FIG 7A

ORS=1000  (Continuous) ID-Output

| Prefix | Reg-ID | Vendor ID | Revision ID | Post fix | Stopp Signature |

ORS=1010  Continuous Sensor Value Output

| Prefix | Sensor ValueA | Sensor ValueB | Sensor ValueC | Post fix | Stopp Signature |

→ t

ORS = 1100

(discontinuous) seperated ID-Output t

ORS = 1110

(discontinuous) seperated Sensor Value Output t

ORS=1100 discontinuous seperated ID-Output

ORS=1000

Continous ID-Output

BUFFER CIRCUIT FOR A MEMORY MODULE

The invention relates to a buffer circuit for a memory module.

A memory module can comprise DRAM chips. These memory chips are mounted on a printed circuit board (PCB).

There is a need to read out memory module specific information data from the memory module.

BRIEF DESCRIPTION OF THE DRAWINGS

FIGS. 6A, 6B, 6C show a data structure of an output request setting, an access mode control setting as used by a buffer circuit according to an embodiment of the present invention.

FIGS. 7A, 7B show exemplary output data formats as employed by a buffer circuit according to an embodiment of the present invention.

DETAILED DESCRIPTION OF THE INVENTION

Figure 1:
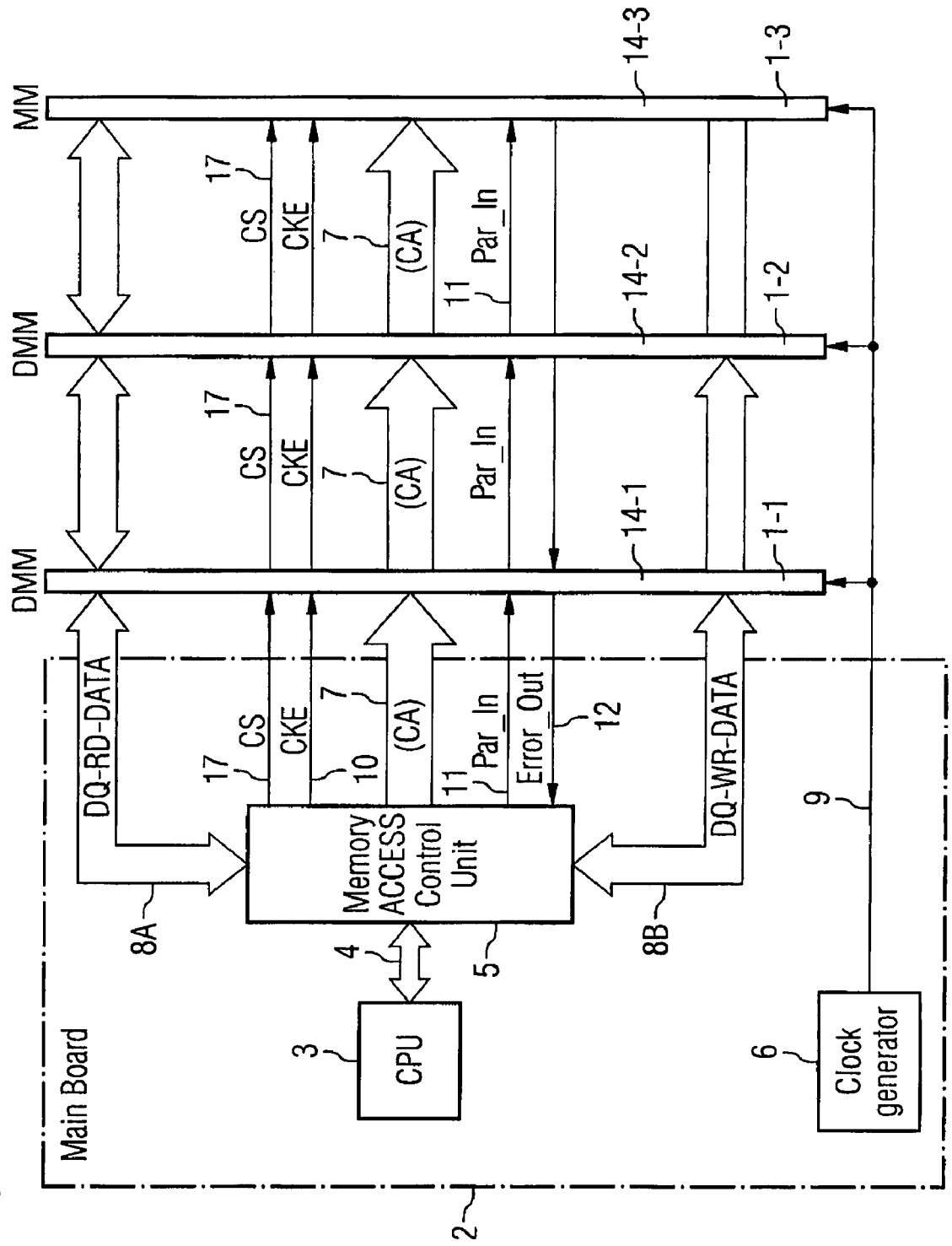
FIG. 1 shows a system comprising several memory modules according to an embodiment of the present invention.

FIG. 1 shows an exemplary embodiment of a system comprising several memory modules 1 each having a buffer circuit according to an embodiment of the present invention. Within the exemplary system as shown in FIG. 1, the data storage comprises three memory modules 1-1, 1-2, 1-3 connected to a main board 2 comprising at least one processing unit 3. The processing unit 3 of the main board 2 is connected via a bus 4 to a memory access control unit 5 mounted on said main board 2. Furthermore, a clock generator 6 is provided on the main board 2. The memory access control unit 5 is connected to the memory modules 1-1, 1-2, 1-3 via a command and address bus 7. Furthermore, the memory access control unit 5 receives data from the memory modules 1 via a data bus 8A and writes data to the memory chips of the memory modules 1-$i$ via a data bus 8B. A clock signal CLK generated by the clock generator 6 is applied via a clock line 9 to buffer circuits mounted on the memory modules 1. The memory access control unit 5 applies a clock enable CKE to buffer circuits which are in a possible embodiment are mounted on the memory module 1-$i$ via a control line 10. To minimize the error rate of the data transmission, the memory access control unit 5 further applies an error check signal such as a parity signal to the buffer circuits of the memory modules 1 via at least one parity control line 11. The memory access control unit 5 receives an error signal or an error signature via at least one error signal line 12.

Figure 2:
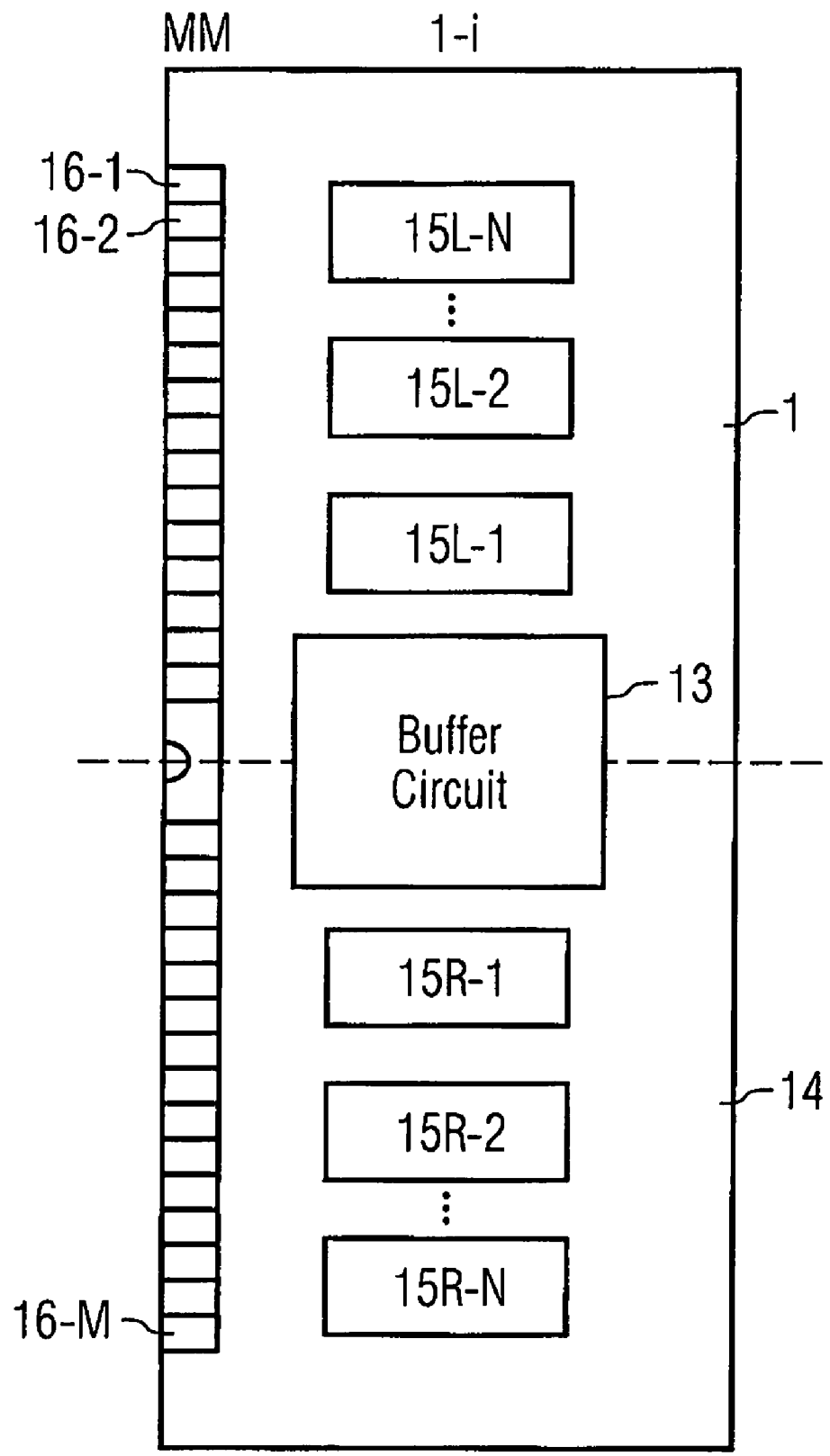
FIG. 2 shows a possible embodiment of a memory module according to the present invention.

FIG. 2 shows an exemplary embodiment of a memory module 1 as used by the system as shown in FIG. 1. The memory module 1 comprises at least one buffer circuit 13 mounted on a printed circuit board 14 of said memory module 1. The buffer circuit 13 is located in the shown embodiment in center of the memory module 1. The buffer circuit 13 is in the embodiment shown in FIG. 2 connected via a bus to memory chips 15 located to the left and to the right side of the buffer circuit 13. The memory chips 15 are mounted on the printed circuit board 14 of the memory module 1 and are connected via a data, command and address bus to the buffer circuit 13. The memory chips 15 can be formed by any kind of memory chips such as DRAMs. In a possible embodiment, the memory chips 15 are formed by stacked memory chips.

The memory module 1 as shown in FIG. 2 further comprises a plurality of connection pins 16 connecting the memory module 1 to the memory access control unit 5. For example, the memory module 1 comprises M connection pins. In possible embodiments, the number M of connection pins is 72, 144, 168, 184, 200 or 240 pins. Any other number M of connection pins is possible depending on the respective standard.

In a possible embodiment, the memory module 1 as shown in FIG. 2 comprises memory chips on one or on both sides of the printed circuit board 14.

The connecting pins 16 of the memory module 1 are plugged into a corresponding socket for connecting the memory module 1 to the memory access control unit 5 as shown in FIG. 1. The memory module 1 shown in FIG. 2 is a buffered memory module having at least one buffer circuit 13.

The signals received by a memory module 1 from the memory access control unit 5 are amplified before they are applied to the memory chips 15 mounted on the printed circuit board 14 of the memory module 1.

Figure 3:
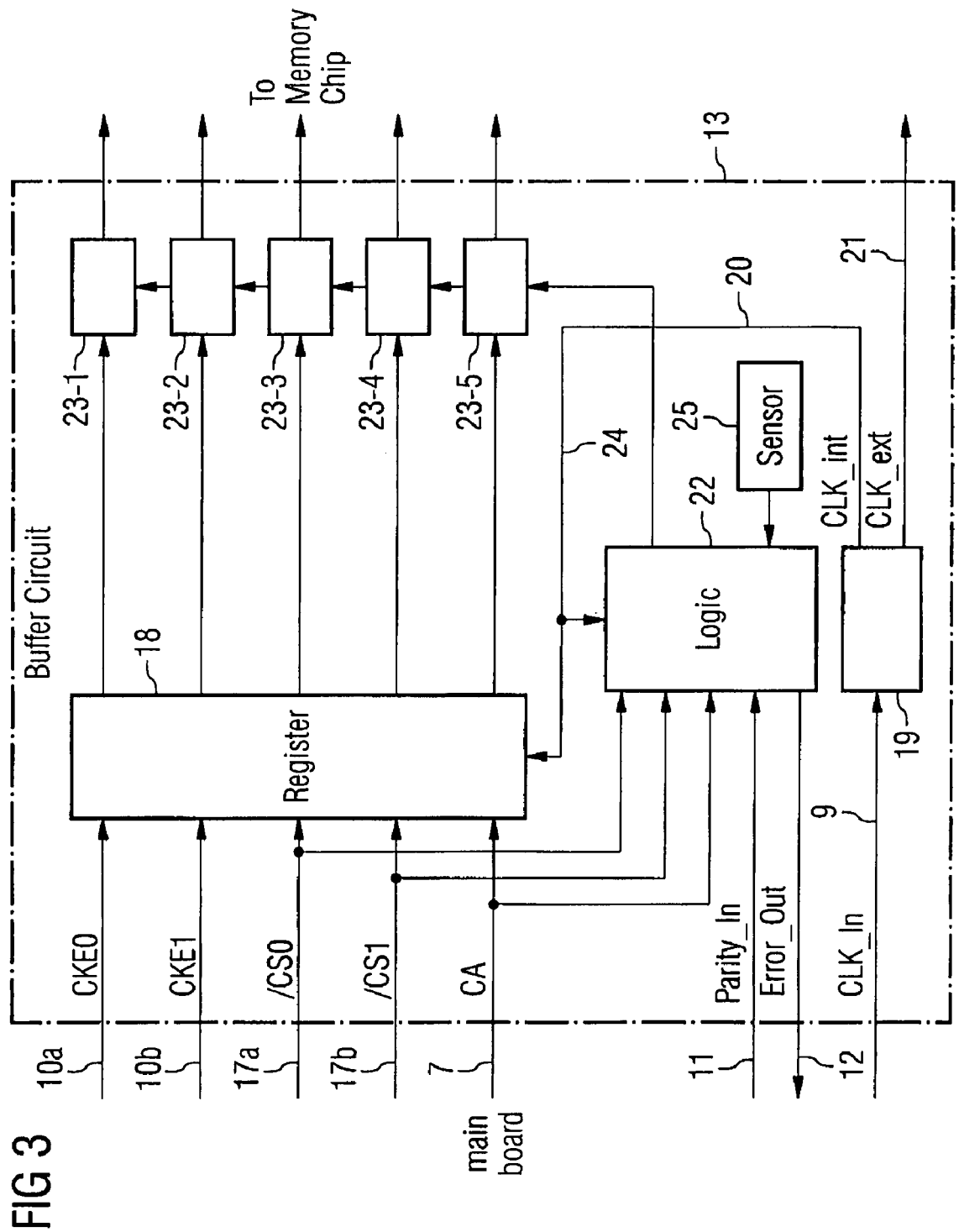
FIG. 3 shows a block diagram of a possible embodiment of a buffer circuit mounted on a memory module according to the present invention.

FIG. 3 shows a block diagram of a possible embodiment of a buffer circuit 13 provided in the memory module 1 as shown in FIG. 2.

The buffer circuit 13 comprises a clocked register 18. The register 18 comprises several flip-flops FF which can be connected in parallel. The buffer circuit 13 receives via the clock line 9 a clock signal CLK generated by the clock generator 6 of the main board 2. The input clock signal $CLK_{IN}$ is applied to a clock control circuit 19 within the buffer circuit 13. The clock control circuit 19 is realized in a possible embodiment by a PLL-circuit or a DLL-circuit. In an embodiment, the clock control circuit 19 is formed by a separate chip mounted on the printed circuit board 14 of the memory module 1. The clock control circuit 19 generates an internal clock signal $CLK_{INT}$ which is applied to a register 18 via an internal clock line 20 of the buffer circuit 13. The clock control circuit 19 further generates a clock signal $CLK_{EXT}$ which is applied to the memory chips 15 of the memory module 1 via a clock line 21. The internal clock signal $CLK_{INT}$ generated by the clock control circuit 19 is also applied to an internal logic 22 within the buffer circuit 13. The clocked register 18 receives command and address signals via the command and address bus 7 from the memory access control unit 5 and forwards them synchronically to the memory chips 15 of the memory module 1. Furthermore, the clocked register 18 forwards the clock enable signals CKE and the chip select signals CS to the memory chips 15.

The forwarded signals are amplified or driven by controllable output drivers 23 as shown in FIG. 3. Each controllable output driver 23 comprises several signal amplifiers connected in parallel which can be switched on or off depending on configuration data stored in a configuration bank within the logic 22. The configuration data is applied to the controllable output drivers via internal control lines 24 as shown in FIG. 3. With the configuration data stored in the configuration bank of the logic 22 it is possible to adjust the signal strength or signal amplitude of the signals output by the buffer circuit 13 to the memory chips 15 of the memory module 1. The buffer circuit 13 further can comprise in a possible embodiment one or more sensors 25, such as temperature sensors.

The logic 22 receives the command and address signals CA as well as chip select signals CS from the memory access control unit 5. Furthermore, the logic 22 receives at least one error check signal such as a parity signal via a line 11 to check the parity of the command and address signals CA. The logic 22 outputs an error out signal or an error signature via line 12 to the memory access control unit 5 as shown in FIGS. 1 and 3.

Figure 4:
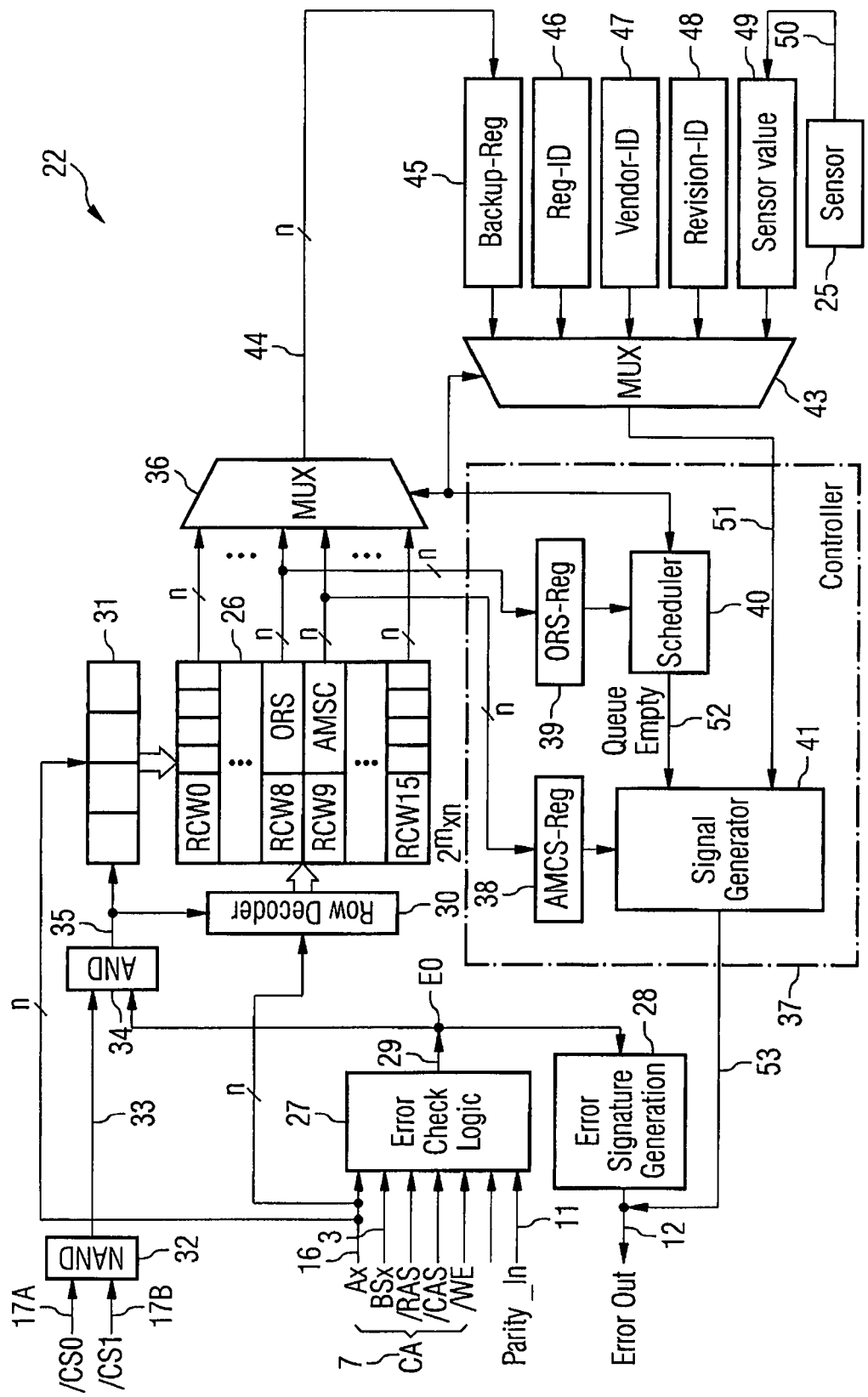
FIG. 4 shows a detailed block diagram of a logic within a buffer circuit according to an embodiment of the present invention.

FIG. 4 shows the logic 22 of FIG. 3 in more detail. The logic 22 within the buffer circuit 13 comprises at least one configuration register bank 26 for storing configuration data of the buffer circuit 13, such as configuration data for the output drivers 23. The configuration register bank 26 comprises several possible configuration registers 26-$i$ for storing register control words RCW. Each register control word RCW comprises several bits, for example n=4 bits. In a possible embodiment, the configuration bank 26 is a 16*4 bit register bank, i. e. comprising 16 register code words RCW each having four bits.

The logic 22 further comprises an error check logic 27 connected to the command and address bus 7. The error check logic 27 can be formed in an embodiment by a parity check logic. The command and address bus 7 comprises address lines A and bank select lines BS, a row access signal RAS, a column access signal CAS and a write enable signal WE. Furthermore, the error check logic 27 receives an error check signal such as a parity signal from the memory access control unit 5 via a signal line 11. The error check logic 27 is provided for performing an error check of the input signals applied to the memory module 1 and in case of a transmission failure to generate an error signature output by said memory module 1 via an error output pin of said memory module 1. The error signature is generated in the embodiment as shown in FIG. 4 by an error signature generation circuit 28. The error check logic 27 performs an error check of the applied input signals and generates an error check bit applied to the error signature generation circuit 28 via an internal control line 29. In a possible embodiment when an error check indicates a transmission error, an error out bit EO is set logical low by the error check logic 27 to activate the error signature generation circuit 28 to output a predetermined sequence of bits indicating a transmission failure. A possible error or fail signature is a three-bit sequence such as "001" output by the logic 22 via the error out line 12 to the memory access control unit 5. In contrast, if the error out bit EO set by the error check logic 27 is set to a logic high value indicating a successful transmission, the error signature generation circuit 28 outputs as a pass signature for example a three-bit sequence "111" to the memory access control unit 5.

In the given example of FIG. 4, the error check logic 27 receives sixteen address signals via address lines A and three bank select signals via bank select lines BS of the command and address bus 7 from the memory access control unit 5. A part of the address lines A is connected within the logic 22 to a row decoder 30 and to an input gate 31 provided for the configuration register bank 26. In a possible embodiment, four address lines are connected to the input gate 31 and other four address lines are connected to the row decoder 30. The row decoder 30 addresses a configuration register 26-$i$ within the configuration register bank 26 to access a register code word RCW stored in that configuration register. In a possible embodiment, each configuration register within the configuration register bank 26 comprises four bits. Accordingly, the input gate 31 receives four address signals to write data into the four-bit configuration registers of the configuration register bank 26.

The logic 22 within the buffer circuit 13 further comprises a NAND-gate 32 receiving a first chip select signal CS0 and a second chip select signal CS1 via control lines 17A, 17B from the memory access control unit 5. Both chip select signals CS0, CS1 have a low logical value when a configuration mode of the buffer circuit 13 is activated. Otherwise, the buffer circuit 13 operates in a normal operation mode, i. e. a data access mode. If both chip select signals CS0, CS1 are low a configuration mode is activated to read out information data from the buffer circuit 13. The NAND-gate 32 applies a logic high value via an internal line 33 to an input of an AND-gate 34. If the error out bit EO is high and the configuration mode is selected the row decoder 30 and the input gate 31 are both activated by a high logic signal output by the AND-gate 34 via control line 35. The row decoder 30 and the input bit 31 are activated to write data into a configuration register 26-$i$ of the configuration register bank 26. In a possible embodiment, some of the configuration registers 26-$i$ within the configuration register bank 26 are write protected.

If the error check is performed successfully, for indicating a successful data transmission the error out bit EO is set high (EO=1) and the row decoder 30 and the input gate 31 are both activated if both CS-signals CS0, CS1 are low to select the configuration mode. Then, the address applied via the command and address bus 7 is interpreted as an access address to a register code word RCW within the configuration register bank 26. If the error check is not performed successfully as indicated by a low error out bit (EO=0), the error signature generation circuit 28 outputs a standard error output signature via the error out signal line 12. If the chip select signal CS0, CS1 indicate a normal operation mode the address signals are interpreted as a normal address for a data access to memory chips 15 of the dual inline memory module 1. The configuration mode of the memory access control unit 5 allows access to the data content of the configuration registers of the configuration register bank 26.

As can be seen from FIG. 4, the logic 22 within the buffer circuit 13 comprises a first multiplexer 36 for multiplexing output signals of the configuration register bank 26. In a possible embodiment, two register code words RCW or configuration registers are used for storing an output request setting ORS and an access mode control setting AMCS. In the given example, the output request setting ORS is stored as a register code word 8 in configuration register 26-8 and the access mode control setting AMCS is stored as a register code word 9 in the configuration register 26-9 of the configuration register bank 26. In the given example of FIG. 4, each register code word RCW comprises four bits.

In a possible embodiment, the output request setting ORS comprises one output request bit ORB, a separation bit and two content bits CA, CB as shown in FIG. 6A. In other embodiments, the number of output request bits ORB, separation bits or content bits may vary.

In the embodiment shown in FIG. 4, the access mode control setting AMCS comprises four bits stored in the configuration register 26-9 as a register code word RCW 9. In the exemplary embodiment, the access mode control setting AMCS comprises a signature on/off bit, a prefix on/off bit, a postfix on/off bit and a slow mode on/off bit as shown in FIG. 6B.

The output request setting ORS and the access control setting AMCS can be loaded via internal lines from the configuration register bank 26 into registers of a controller 37. In the given example, the controller 37 comprises an AMCS register 38 and an ORS register 39. The controller 37 comprises a scheduler 40 having access to the ORS register 39. Furthermore, the controller 37 comprises a wave or signal generator 41 having access to the data content of the AMCS register 38.

The controller 37 comprising the scheduler 40 and the signal generator 41 can be formed in a possible embodiment by an ASIC. The scheduler 40 controls via control lines 42 the first multiplexer 36 and a further second multiplexer 43. The output of the first multiplexer 36 is connected via configuration data lines 44 to a multi-purpose back-up register 45 storing, for example four bits. The other inputs of the second multiplexer 43 are connected to other registers, such as a register-ID 46, a vendor-ID register 47 and a revision-ID register 48. In a possible embodiment, the registers 46, 47, 48 are fused so that the data stored in these registers cannot be lost. A further input of the second multiplexer 43 as shown in the exemplary embodiment is connected to a sensor value register 49 connected via a signal line 50 to a sensor 25 of the buffer circuit 13. The sensor 25 can be formed in a possible embodiment by a temperature sensor. Other kinds of sensors are also possible. The sensor value, such as a value indicating a temperature, is output by the sensor 25 and stored temporarily in the sensor value register 49.

The register-ID 46 stores a register identification value as relevant information data of the buffer circuit 13.

The vendor-ID register 47 stores a vendor identification as relevant information data of the buffer circuit 13.

The revision-ID register 48 stores a revision identification as relevant information data of the buffer circuit 13.

Any kind of relevant information data can be stored in further registers connected to the second multiplexer 43.

The back-up register 45 allows to store temporarily data read out from the configuration register bank 26 via the first multiplexer 36. For example, the data content of the register code word 0 within the configuration register 26-0 of the configuration register bank 26 can be switched by means of the first multiplexer 36 to the back-up register 45 forming an input register for the second multiplexer 43.

The output of the second multiplexer 43 is connected to the signal generator 41 via an internal signal line 51. Furthermore, the scheduler 40 outputs a queue empty indication signal via a line 52 to the signal generator 41. The signal generator 41 outputs a signal via a line 53 to the error out signal line 12 of the buffer circuit 13. In a possible embodiment, the controller 37, the scheduler 40 and the signal generator 41 are formed by a finite state machine FSM.

Figure 5:
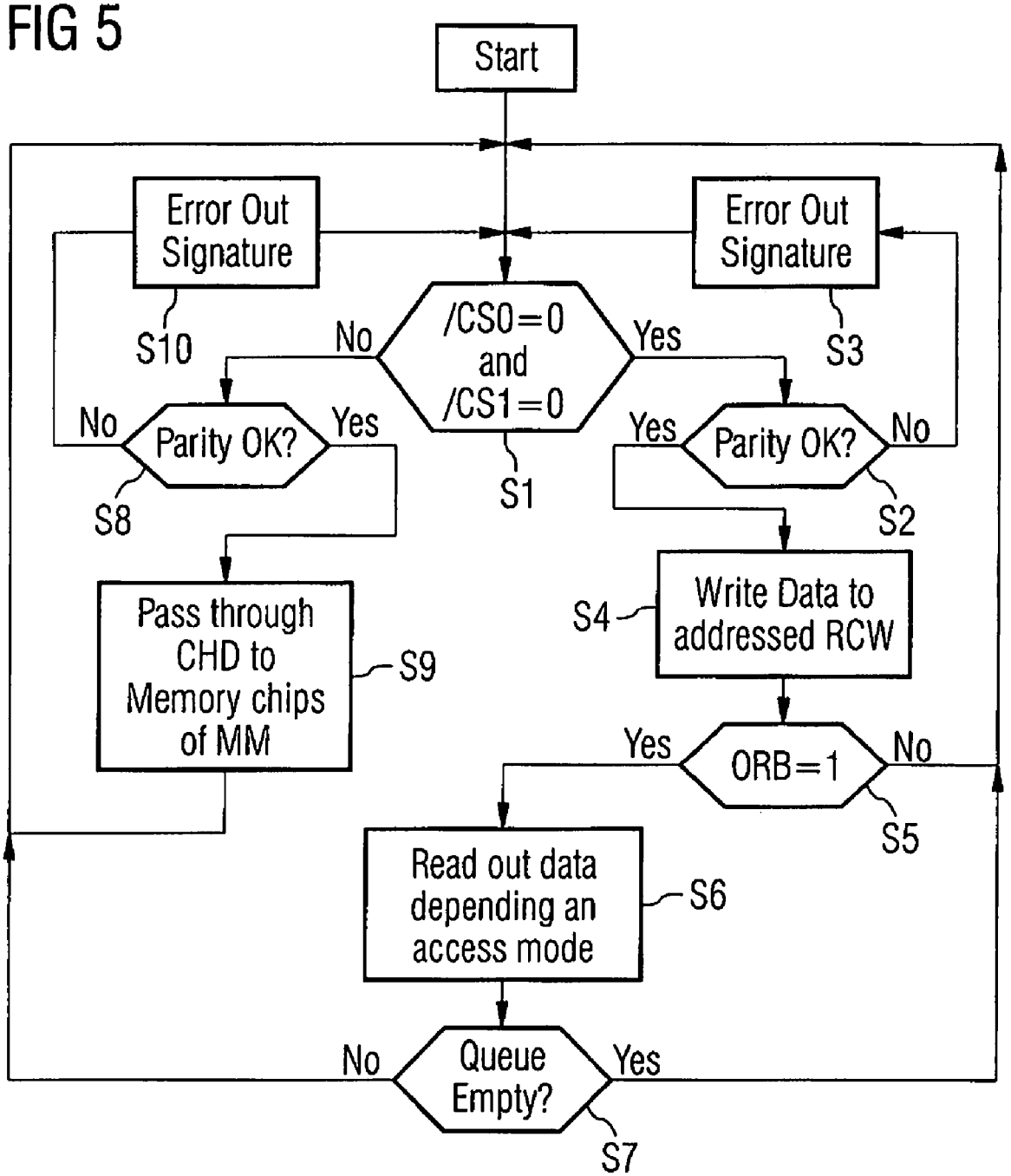
FIG. 5 shows a flow chart of a possible embodiment of a method according to the present invention.

FIG. 5 shows a flowchart of a possible embodiment of a process performed by the controller 37 within the logic 22 of the buffer circuit 13.

After the start S0, the logic 22 evaluates in step S1 the chip select control signals CS0, CS1 applied by the memory access control unit 5 via control lines 17A, 17B to the logic 22 of the buffer circuit 13. If both chip select signals CS0, CS1 have a low logical value, the buffer circuit 13 is switched from a normal operation mode to a configuration data read mode to access information data stored within the buffer circuit 13.

In a step S2, the error out bit EO output by the error check logic 27 is evaluated. If the error out bit has a logical high value indicating a successful error check, such as a successful parity check, the low decoder 30 and the input gate 31 of the configuration register 26 are both activated by the AND-gate 34. In contrast, when the error out bit EO indicates an unsuccessful parity check by a low logical value, the error signature generation circuit 28 generates an error out signature, such as the three-bit sequence "110" in step S3 output to the memory access control unit 5 via the error out line 12.

If the error check is OK and the configuration mode is activated, the address applied to the logic 22 is interpreted by the row decoder 30 as a register code word RCW access address. Data on an address line connected to the input gate 31 is then written to the configuration register bank 26 in step S4, if the addressed register 26-i is not write protected.

In a possible embodiment, the output request setting ORS is loaded automatically into the ORS register 39 of the controller 37. The ORS setting as shown in FIG. 6A comprises in a possible embodiment an output request bit ORB, a separation bit and some content bits. The scheduler 40 evaluates the ORS setting stored in the ORS register 39. If the controller 37 recognizes that the output request bit ORB is set in step S5, the multiplexers 36, 43 are controlled via a controller 42 of the scheduler 40 depending on the access mode defined by the bits of the output request setting ORS in step S6.

The data format of the output data is controlled by the data content of the AMCS register 38 interpreted by the signal generator 41. When the signal generator 41 receives a queue empty control signal from the scheduler 40 via an internal signal line 52 in step S7 the process switches back to the normal operation mode and loops back to step S1.

If the chip select signals CS0, CS1 indicate a normal operation mode in step S1 and it is decided that the error check is performed successfully in step S8, the command and address signals CA are forwarded by the buffer circuit 13 to the memory chip 15 for a normal data access. If the error out bit during the normal operation indicates no successful data transmission in step S8, the error signature generation circuit 28 outputs an error out signature in step S10.

FIGS. 6A, 6B show a possible data structure of an output request setting ORS and an access mode control setting AMCS which can be loaded to the AMCS register 38 and the ORS register 39 of the controller 37. The output request setting ORS in the given example comprises two content bits CA, CB allowing four different modes for data output by the circuit buffer 13.

In a first read out mode, if content bits CA=0 and CB=0 identification data stored in identification registers, such as identification registers 46, 47, 48 in FIG. 4 are read out from the buffer circuit 13 to the memory access control unit 5.

In a further read out mode indicated by content bits CA=0 and CB=1, a register dump is performed, i. e. data stored in the back-up register 45 is output via the second multiplexer 43 from the controller 37 to the error out signal line 12. In the back-up register 45, configuration data read out from the configuration register bank 26 via the first multiplexer 36 is stored temporarily. For example, the scheduler 40 which controls the first multiplexer 36 can read out predefined register code words RCW from the configuration register bank 26 to the multi-purpose back-up register 45. In a possible embodiment, the scheduler 40 receives further control signals to select a register code word RCW from the configuration register bank 26.

A further read out mode is indicated by content bits CA=1 and CB=0, wherein a sensor value is read out by the controller 37, for example from a sensor value register 49 as shown in FIG. 4.

In the given example of FIG. 6C, the combination of CA=1 and CB=1 is not yet defined.

Further output modes can be defined by using more content bits C.

The data format of the data read out in step S6 depends on the access mode. The signal generator 41 evaluates the data content of the AMCS register 38 as shown in FIG. 6B. The access mode control setting AMCS comprises in the given example a stop signature on/off control bit, a prefix on/off control bit, postfix on/off control bit and a slow mode on/off control bit. If the stop signature control bit is set the signal generator 41 generates a predetermined stop signal indicating to the memory access control unit 5 that the read access is completed.

If the prefix control bit is set, the signal generator 41 generates a predetermined prefix or predetermined bit pattern.

If the postfix control bit is set, the signal generator 41 generates a postfix, i. e. the sequence of predetermined bits or a predetermined bit pattern.

If the slow mode control bit is set, the data output by the signal generator 41 is output in a slow mode, i. e. one data bit is output during several clock terms. This is useful when, for example the memory access control unit 5 is not as fast as the buffer circuits 13.

FIGS. 7A, 7B show two examples of a continuous information data output. In FIG. 7A, the output request setting ORS is "1000", i. e. the output request bit ORB is set, the separation bit is low indicating a continuous data output and the content bits CA, CB are set to "00" indicating an identification data output mode as shown in FIG. 6C. In this example, the signal generator 41 generates a prefix followed by a number of identification data such as register identification, vendor identity and revision identification followed by a postfix. At the end of the data transmission, a stop signature is transmitted. The register-ID, the vendor-ID and the revision-ID are read from the registers 46, 47, 48 as shown in FIG. 4. The prefix and the postfix bit pattern are generated by the signal generator 41 as well as the stop signature.

In the example of FIG. 7B, the output request setting ORS is set to "1010", i. e. an output request bit ORB is set followed by a separation bit indicating a continuous data output. The content bits CA, CB="10" indicate that sensor values are read out as shown in the table of FIG. 7C. Accordingly, the signal generator 41 of the controller 37 outputs a prefix followed by a sequence of sensor values from different sensor value registers, such as the sensor value register 49 shown in FIG. 4. This is followed by a postfix bit pattern and a stop signature.

Figure 8A:
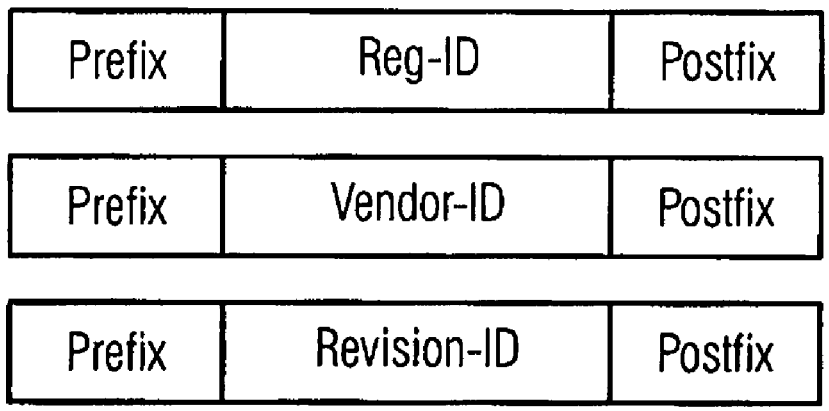
FIGS. 8A, 8B show further possible formats of data output by the buffer circuit according to a possible embodiment of the present invention.
Figure 8A:
Figure 8B:
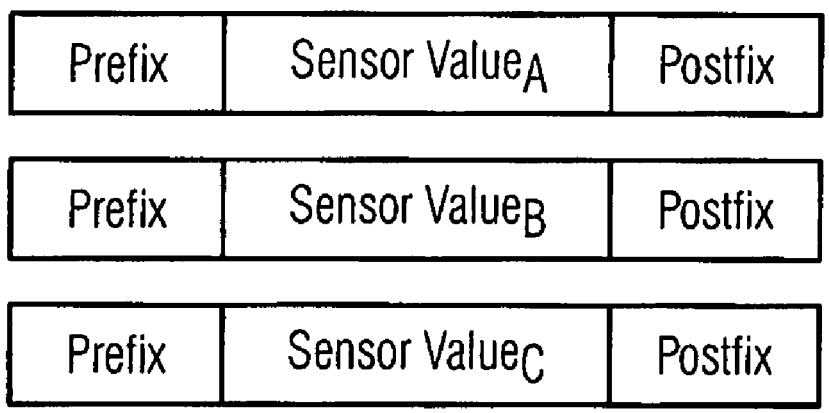
Figure 8B:

FIGS. 8A, 8B show further examples of output data read out from the buffer circuit 13. In the given example of FIG. 8A, the output request setting ORS is "1100", i. e. the output request bit ORB is set and a separation bit is also set. The content bits indicate an identification data output mode as indicated in FIG. 6C. In the given example, a discontinuous separated output of identification data is performed by the signal generator 41, i. e. each ID-data is preceded by a prefix and followed by a postfix.

In the example of FIG. 8B, the content bits CA, CB indicate to read out of sensor values. Accordingly, in this example, a discontinuous separated output of the sensor values is performed by the signal generator 41 so that each sensor value is preceded by a prefix and followed by a postfix.

Figure 9A:
FIGS. 9A, 9B show further an exemplary format of data output by the buffer circuit according to an embodiment of the present invention.
Figure 9A:
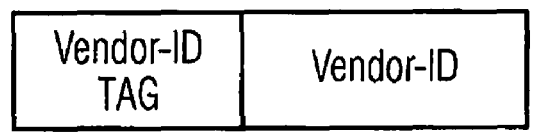
Figure 9A:
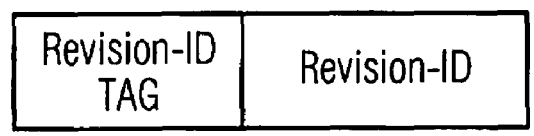
Figure 9A:
Figure 9A:
Figure 9B:
Figure 9B:

FIGS. 9A, 9B show further exemplary embodiments of data output formats. If the ORS setting indicates a discontinuous separated output of identification data, this can also be performed in another implementation as shown in FIG. 9A. In the given example, each identification data is attached to a corresponding tag. The tag indicates the kind of data that follows. In the given example, the register identification tag indicates that the following data is a register identification read from the register 46. The sequence of separated tagged identification data is accomplished by a stop signature generated by the signal generator 41.

FIG. 9B shows a further example wherein the separation bit of the ORS indicates a continuous output of identification data.

As can be seen from the above examples, the signal generator 41 can provide different data formats depending on the data content of the AMCS register 38 and the ORS register 39. The end of the data transmission is indicated by a stop signature.

Figure 10:
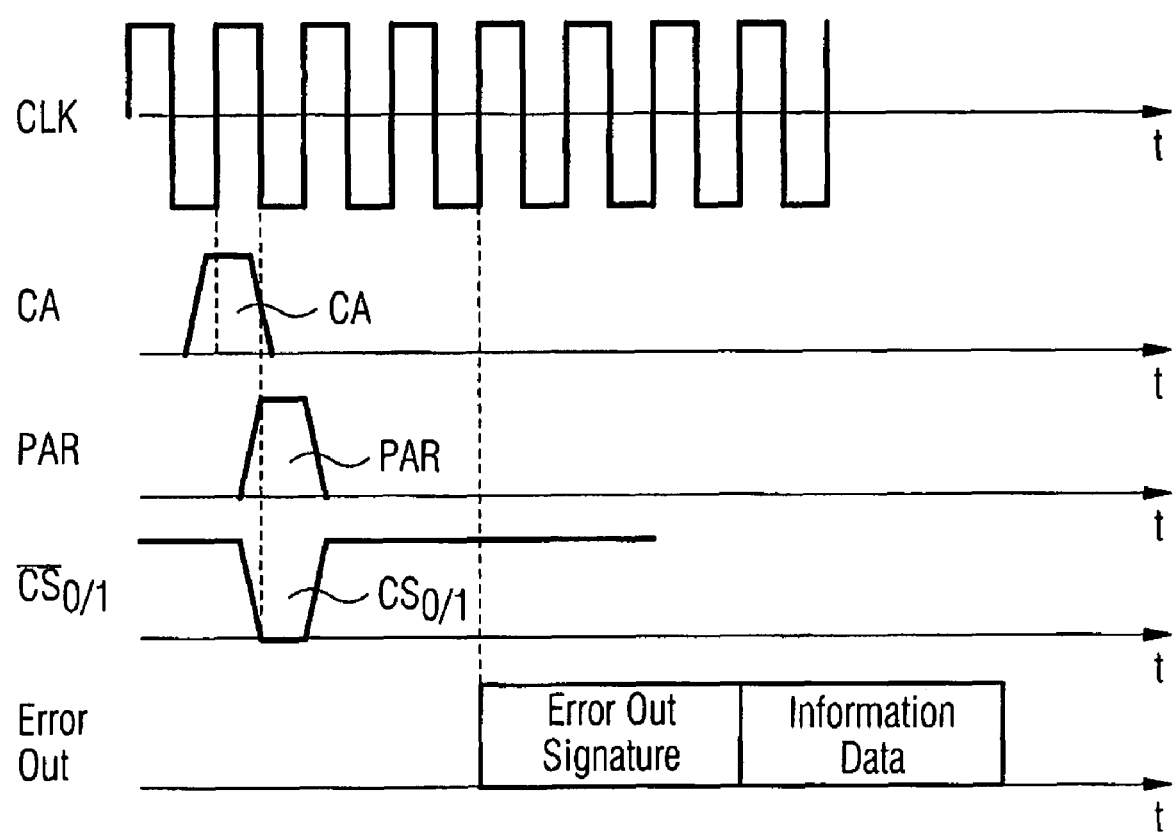
FIG. 10 shows a signal diagram for illustrating the data output according to a further embodiment.

FIG. 10 shows signal diagrams for illustrating the output of information data from the buffer circuit 13 according to an embodiment of the present invention.

The buffer circuit 13 receives a clock signal from the memory access control unit 5 via a clock line 9. Further, the logic 22 of the buffer circuit 13 receives command and address signals CA by the command and address bus 7. One clock cycle later, the logic 22 further receives the parity bit from the memory access control unit 5. If both chip select signals CS0, CS1 applied via signal lines 17A, 17B have a low logic value L, the buffer circuit 13 switches from the normal access mode to a configuration data read mode. After a predetermined number of clock cycles, the error signature generation circuit 28 within the logic 22 outputs an error out signature indicating whether the data transmission from the memory access control unit 5 to the buffer circuit 13 was successful or not. A signature can be a three-bit sequence, for example a sequence "111" forms a pass signature and a sequence "001" forms a fail signature. The signature is followed by the information data output from the buffer circuit 13 according to the selected access mode. The data output is completed by a stop bit pattern.

In a possible embodiment, the information data output via the error out line 12 is output in a slow mode. For example, an information data bit is output during three consecutive clock cycles of the clock signal CLK. Accordingly, the information data rate of the information data output from the buffer circuit 13 can be adjusted to the data rate of the attached system.

With the apparatus and the method according to the present invention, it is possible to read out relevant data from a buffer circuit 13 which can be mounted on a printed circuit board 14 of a memory module 1 without the provision of additional connecting pins 16 for the memory module 1. The relevant information data can be either identification data stored in an information data register, such as registers 45, 47, 48 shown in FIG. 4 or sensor values generated by sensors 25 of the buffer circuit 13. Furthermore, it is possible to read out configuration data stored in a configuration registered bank 26 as relevant data. Other possibly relevant data can be read out from the buffer circuit 13, for example a PLL-phase or data indicating a manufacturer of said memory buffer circuit.

The information data can be read out from the buffer circuit 13 in different data formats or access modes which are selectable by the memory access control unit 5. The information data from the different memory modules 1 can be evaluated by the memory access control unit 5 or forwarded to the CPU 3 of the motherboard 2. In the very early stage of a system boot e.g. this additional information can be used for vendor specific boot-up configuration and adjustment. The CPU 3 can evaluate the information data, for example to generate statistical data. This statistical data can, for example, indicate that memory modules 1 having assembled buffer circuits of a certain manufacturer are more likely to fail than other memory modules 1 assembled with buffer circuits from another manufacturer. Furthermore, the evaluation can be supported by sensor data. For example, this sensor data can indicate that certain memory modules 1 fail if the temperature is higher than a temperature threshold value, and the system is throttling down the access to cool the memory channel down. Accordingly, although the number of connection pins in each memory module 1 is not changed it is possible to allow a user to access relevant information about the buffer circuit 13. The memory chips 15 of each memory module 1 can be any kind of memory chips, such as DRAMs. In a possible embodiment, the memory chips 15 are formed by stacked DRAMs.

The invention further provides a method for providing information data from buffer circuits 13 which can be mounted on memory modules 1. The information data is read out via at least one error output pin of the memory module 1 depending on the output request setting ORS which can be written in the configuration register 26-*i* of a configuration register bank 26, such as the register code word RCW8 as shown in FIG. 4.

What is claimed is:

1. A buffer circuit for a memory module comprising:
   (a) at least one configuration register bank for storing configuration data of said memory module;
   (b) an error check logic for performing an error check of input signals applied to said memory module via input pins of said memory module to generate a signature output by said memory module via at least one output pin of said memory module; and
   (c) a controller which depending on an output request setting stored in a configuration register of said configuration register bank reads out information data of said buffer circuit via said at least one output pin of said memory module.

2. The buffer circuit according to claim 1, wherein said information data is stored in a configuration register of said configuration register bank.

3. The buffer circuit according to claim 1, wherein said information data is stored in an information data register of said buffer circuit.

4. The buffer circuit according to claim 1, wherein said information data comprises
   configuration data stored in a configuration register of said configuration register bank,
   a register identification stored in an information data register,
   a revision identification stored in an information data register,
   a vendor identification stored in an information data register, and
   a sensor value stored in a sensor register.

5. The buffer circuit according to claim 1, wherein said output request setting comprises
   at least one output request bit,
   at least one separation bit, and
   at least one information content bit.

6. The buffer circuit according to claim 5, wherein said output request setting is loadable from said configuration register in an ORS (Output Request Setting)-register of said controller.

7. The buffer circuit according to claim 1, wherein said controller comprises a scheduler for controlling multiplexers to switch information data to a signal generator of said controller.

8. The buffer circuit according to claim 1, wherein said controller is formed by a finite state machine.

9. The buffer circuit according to claim 1, wherein an access mode control setting is stored in a configuration register of said configuration register bank.

10. The buffer circuit according to claim 9, wherein said access mode control setting is loadable from said configuration register into an AMCS (Access Mode Control Setting)-register of said controller.

11. The buffer circuit according to claim 10, wherein said information data is output in a selectable output data format by said signal generator depending on said access mode control setting via said at least one output pin of said memory module.

12. The buffer circuit according to claim 9, wherein said access mode control setting comprises
   at least one stop signature setting bit,
   at least one prefix setting bit,
   at least one postfix setting bit, and
   at least one slow mode setting bit.

13. The buffer circuit according to claim 1, wherein said buffer circuit comprises a signature generation circuit for generating said signature in response to an error check control signal output by said error check logic of said buffer circuit.

14. The buffer circuit according to claim 1, wherein a command and address bus is connected to said error check logic of said buffer circuit to apply command and address signals via input pins of said memory module to said error check logic.

15. The buffer circuit according to claim 1, wherein said error check logic is formed by a parity check logic.

16. The buffer circuit according to claim 14, wherein said command and address bus comprises
   address lines,
   bank select lines,
   a row select address signal,
   a column address select signal, and
   a write enable signal.

17. The buffer circuit according to claim 1, wherein said buffer circuit comprises a row decoder and an input gate for said configuration register bank.

18. The buffer circuit according to claim 17, wherein said row decoder and said input gate are connected to address lines of a command and address bus.

19. The buffer circuit according to claim 17, wherein said input gate and said row decoder of said configuration register bank are controlled depending on an error check control signal output by said error check logic and depending on chip select signals applied to said buffer circuit via input pins of said memory module.

20. The buffer circuit according to claim 1, wherein said buffer circuit comprises at least one sensor for generating a sensor value stored in an information data register.

21. The buffer circuit according to claim 20, wherein said sensor is a temperature sensor.

22. The buffer circuit according to claim 7, wherein said signal generator of said controller is an ASIC.

23. The buffer circuit according to claim 1, wherein said buffer circuit comprises a clock control circuit for generating an internal clock signal for said buffer circuit and an external clock signal for memory chips of said memory module.

24. The buffer circuit according to claim 23, wherein said clock control circuit is a PLL-circuit or a DLL-circuit.

25. The buffer circuit according to claim 24, wherein said information data comprises a PLL-phase data of said PLL-circuit.

26. The buffer circuit according to claim 1, wherein said memory module comprises several memory chips.

27. The buffer circuit according to claim 26, wherein said memory chips are DRAM-chips.

28. The buffer circuit according to claim 27, wherein said memory chips are stacked DRAM-chips.

29. The buffer circuit according to claim 1, wherein said memory module is a dual inline memory module.

30. A memory module comprising a buffer circuit having
(a) at least one configuration register bank for storing configuration data of said memory module;
(b) an error check logic for performing an error check of input signals applied to said memory module via input pins of said memory module to generate a signature output by said memory module via at least one output pin of said memory module; and
(c) a controller which depending on an output request setting stored in a configuration register of said configuration register bank reads out information data of said buffer circuit via said at least one output pin of said memory module.

31. The memory module according to claim 30, wherein said memory module further comprises memory chips connected to said buffer circuit via a bus of said memory module.

32. The memory module according to claim 30, wherein said memory module is a dual inline memory module.

33. The memory module according to claim 32, wherein said dual inline memory module is a registered dual inline memory module.

34. A dual inline memory module with at least one buffer circuit comprising:
(a) at least one configuration register bank for storing configuration data of said memory module;
(b) an error check logic for performing an error check of input signals applied to said memory module via input pins of said memory module to generate a signature output by said memory module via at least one output pin of said memory module;
(c) a controller which depending on an output request setting stored in a configuration register of said configuration register bank reads out information data of said buffer circuit via said at least one output pin of said memory module; and
(d) at least one memory chip connected to said buffer circuit.

35. The dual inline memory module according to claim 34, wherein said memory chips are DRAM-memory chips.

36. The dual inline memory module according to claim 35, wherein said DRAM-memory chips are stacked DRAM-memory chips.

37. The dual inline memory module according to claim 34, wherein said dual inline memory module is a registered dual inline memory module.

38. The buffer circuit according to claim 16, wherein said buffer circuit comprises a row decoder and an input gate for said configuration register bank.

39. The buffer circuit according to claim 38, wherein said row decoder and said input gate are connected to the address lines of said command and address bus.

* * * * *